(12) United States Patent
Terada

(10) Patent No.: US 6,294,484 B1
(45) Date of Patent: Sep. 25, 2001

(54) METHOD OF FORMING TEOS OXIDE FILMS

(75) Inventor: Nobuhiro Terada, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/605,659

(22) Filed: Jun. 28, 2000

(30) Foreign Application Priority Data

Sep. 7, 1999 (JP) .................................................. 11-252765

(51) Int. Cl.[7] .................................................. H01L 21/469
(52) U.S. Cl. ............................................. 438/789; 438/761
(58) Field of Search .................................. 438/761, 907, 438/789

(56) References Cited

U.S. PATENT DOCUMENTS

| | | |
|---|---|---|
| 5,560,778 | 10/1996 | Park et al. . |
| 5,605,867 * | 2/1997 | Sato et al. ............................. 437/235 |
| 5,656,337 | 8/1997 | Park et al. . |
| 6,133,160 * | 10/2000 | Komiyama et al. ................. 438/761 |

FOREIGN PATENT DOCUMENTS

| | | |
|---|---|---|
| 8-97285 | 4/1996 | (JP) . |
| 9-64031 | 3/1997 | (JP) . |

* cited by examiner

Primary Examiner—David Nelms
Assistant Examiner—David Vu
(74) Attorney, Agent, or Firm—Jones Volentine, PLLC

(57) ABSTRACT

With a construction wherein an interlayer insulating film of a semiconductor device is comprised of a TEOS oxide film formed by means of the plasma CVD method as an underlayer of the interlayer insulating film, and a TEOS oxide film formed by means of the CVD method as an upper layer of the same, laminated to the former, the thickness of the upper layer film is increased by changing an output in low frequency bands of RF, or changing a ratio of a TEOS gas flow rate to an $O_2$ flow rate in applying the plasma CVD method to form the underlayer film.

14 Claims, 4 Drawing Sheets

FIG. 7 (A) (PRIOR ART)
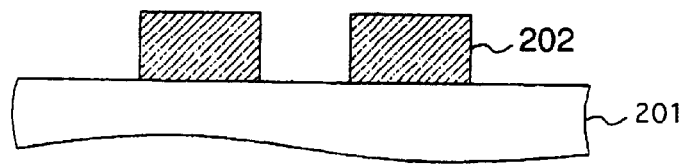
FIG. 7 (B) (PRIOR ART)
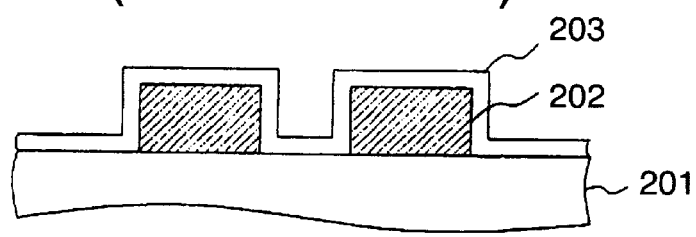
FIG. 7 (C) (PRIOR ART)
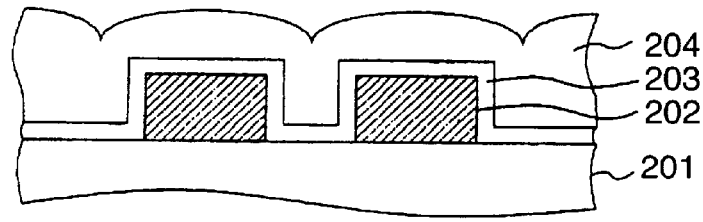

US 6,294,484 B1

METHOD OF FORMING TEOS OXIDE FILMS

BACKGROUND OF THE INVENTION

1. Field of the Invention

The invention relates to a method of forming TEOS oxide films for use as an interlayer insulating film. In particular, the invention is concerned with a method of controlling the thickness of one of the TEOS oxide films.

2. Description of the Related Art

There have been in use two kinds of TEOS (Tetra Ethyl Ortho Silicate) oxide films for an interlayer insulating film to be formed between metal patterns of a semiconductor device.

FIGS. 7A to 7C are sectional views showing a conventional method of forming the interlayer insulating film between the metal patterns of the semiconductor device.

With the conventional method, as shown in FIG. 7A, a metal pattern (made of W, Al, etc.) 202 is first formed on a semiconductor substrate 201.

Subsequently, as shown in FIG. 7B, a plasma TEOS oxide film 203 having excellent coating property is formed on top of the metal pattern 202.

The plasma TEOS oxide film is an oxide film formed by means of the plasma CVD method using, for example, an oxygen ($O_2$) gas and a TEOS [$Si(OC_2H_5)_4$] gas.

Thereafter, as shown in FIG. 7C, an $O_3$-TEOS oxide film 204 having excellent self-flattening property is formed on top of the plasma TEOS oxide film 203. The $O_3$-TEOS oxide film is formed by means of the CVD method using an ozone ($O_3$) gas and a TEOS gas.

However, a conventional structure wherein the plasma TEOS oxide film 203 is used at an underlayer has had a drawback in that the $O_3$-TEOS oxide film 204 at an upper layer is prone to be affected by the substrate (after metal patterning), and consequently, becomes thinner in thickness than a target thickness.

Further, there has arisen another problem as a result of the thickness of the $O_3$-TEOS oxide film 204 becoming thinner in that when forming a second metal pattern over the interlayer insulating film, there have occurred sites of the interlayer insulating film, in an undesirable step shape, that is, sites thereof in sectional shape at a very steep gradient, susceptible to formation of constricted parts, between the metal patterns, so that metal remnants are prone to be generated.

The invention has been developed to eliminate the problems described above, and an object of the invention is to provide a method of forming an interlayer insulating film of a semiconductor device, capable of preventing generation of metal remnants by rendering an upper layer of the interlayer insulating film thicker in thickness when forming an upper layer metal pattern over the interlayer insulating film.

SUMMARY OF THE INVENTION

To this end, in accordance with a first aspect of the invention, there is provided a method of forming an interlayer insulating film of a semiconductor device, wherein a plasma TEOS oxide film having a large intra-film electric charge is formed at an underlayer of the interlayer insulating film of the semiconductor device, and a $O_3$-TEOS oxide film formed at an upper layer of the interlayer insulating film is rendered thicker in thickness.

In another aspect of the invention, change in a static charge within the plasma TEOS oxide film at the underlayer may be caused to occur by changing an output in a low frequency band of Rf with respect to the method of forming the interlayer insulating film of the semiconductor device.

With these features, change in the static charge within the plasma TEOS oxide film at the underlayer may be caused to occur by changing a ratio of a TEOS flow rate to an $O_2$ flow rate with respect to the method of forming the interlayer insulating film of the semiconductor device.

BRIEF DESCRIPTION OF THE DRAWINGS

FIGS. 7A to 7C sectional views showing a conventional method of forming ar, interlayer insulating film between metal patterns of a semiconductor device.

DETAILED DESCRIPTION OF THE PREFERRED EMBODIMENTS

An embodiment of a method of forming an interlayer insulating film according to the invention will be described hereinafter with reference to the attached drawings.

Figure 1:
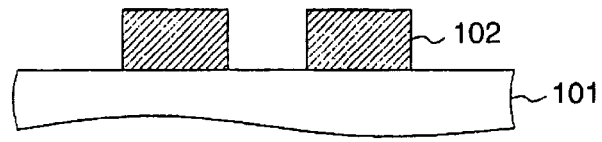
FIGS. 1A to 1C are sectional views showing an embodiment of a method of forming an interlayer insulating film between metal patterns of a semiconductor device, according to the invention.
Figure 1:
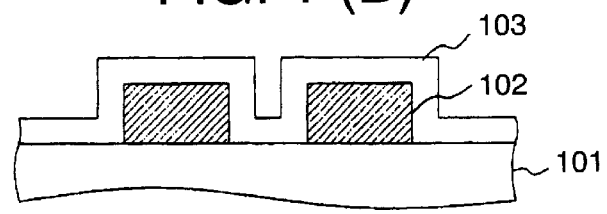
Figure 1:
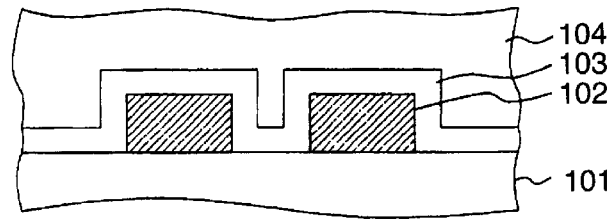

FIG. 1 is a sectional view showing the embodiment of the method of forming the interlayer insulating film between metal patterns of a semiconductor device, according to the invention.

As shown in FIG. 1A, a metal pattern (made of W, Al, etc.) 102 is first formed on top of a semiconductor substrate 101.

Subsequently, as shown in FIG. 1B, a plasma TEOS oxide film 103 having a large intra-film electric charge and excellent coating property is formed on top of the metal pattern 102. The plasma TEOS oxide film according to the embodiment is formed of an $O_2$ gas and a TEOS gas as feedstock.

Subsequently, as shown in FIG. 1C, a $O_3$-TEOS oxide film 104 that has excellent self-flattening property and is to be rendered thicker in thickness is formed on top of the plasma TEOS oxide film 103.

Figure 2:
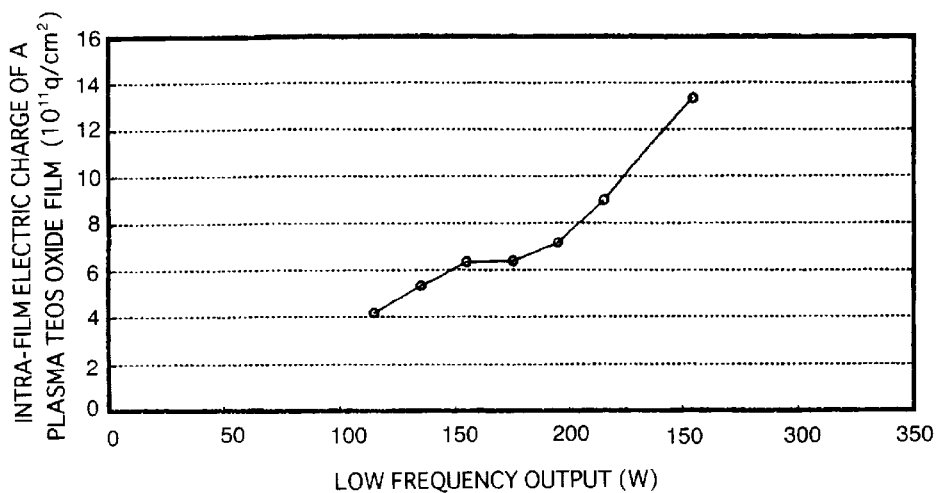
FIG. 2 is a characteristic diagram showing relationship between a low frequency output and an intra-film electric charge with respect to a plasma TEOS oxide film according to the embodiment of the invention, wherein two frequency bands high frequency: 13.56 MHz, low frequency: 430 kHz) of RF are used.

In this connection, an intra-film electric charge (Qox) of the plasma TEOS oxide film 103 for use as an underlayer film is in the order of 1 to $2\times10^{11}$ q/cm$^2$(q: the charge on an electron, $-1.6\times$ path plate path plate $10^{-19}$ coulombs), and as shown in FIG. 2, can be increased by raising a low frequency output. in forming the plasma TEOS oxide film 103 with the use of two frequency (high frequency: 13.56 MHz, low frequency: 430 kHz) bands of RF (Radio Frequency).

Figure 3:
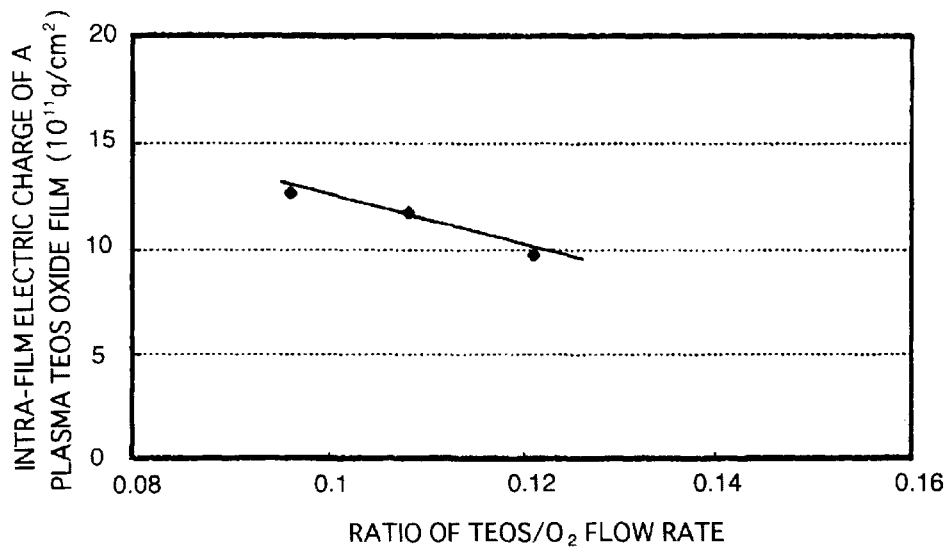
FIG. 3 is a characteristic diagram showing relationship between a ratio of a TEOS flow rate to an $O_2$ flow rate and a Qox value according to the embodiment of the invention, wherein the plasma TEOS oxide film is formed by changing the ratio of the TEOS flow rate to the $O_2$ flow rate (the $O_2$ flow rate being fixed at 1.2 l/min)

Further, as for the plasma TEOS oxide film, as shown in FIG. 3 indicating relationship between a ratio of a TEOS flow rate to an $O_2$ flow rate and a Qox value when the plasma TEOS oxide film is formed by changing the ratio of the TEOS flow rate to the $O_2$ flow rate (the $O_2$ flow rate being fixed at 1.2 l/min), the Qox value can be increased according as the ratio of the TEOS flow rate to the $O_2$ flow rate becomes lower.

Figure 4:
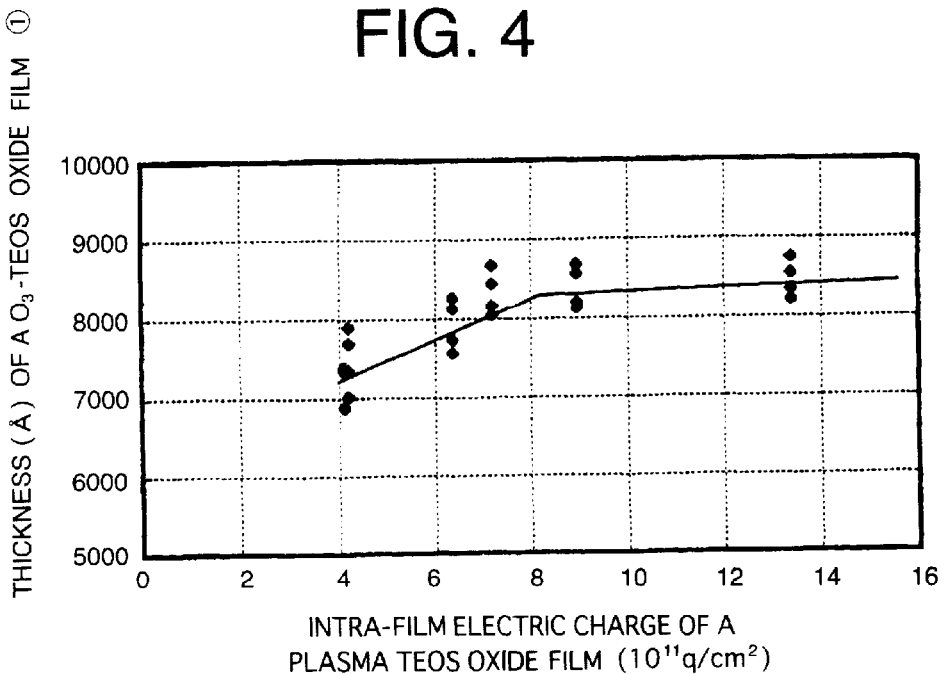
FIG. 4 is a characteristic diagram of the thickness of an upper layer of the interlayer insulating film, formed over a metal pattern (floating) not conductive with the substrate of the semiconductor device, according to the embodiment f the invention.
Figure 5:
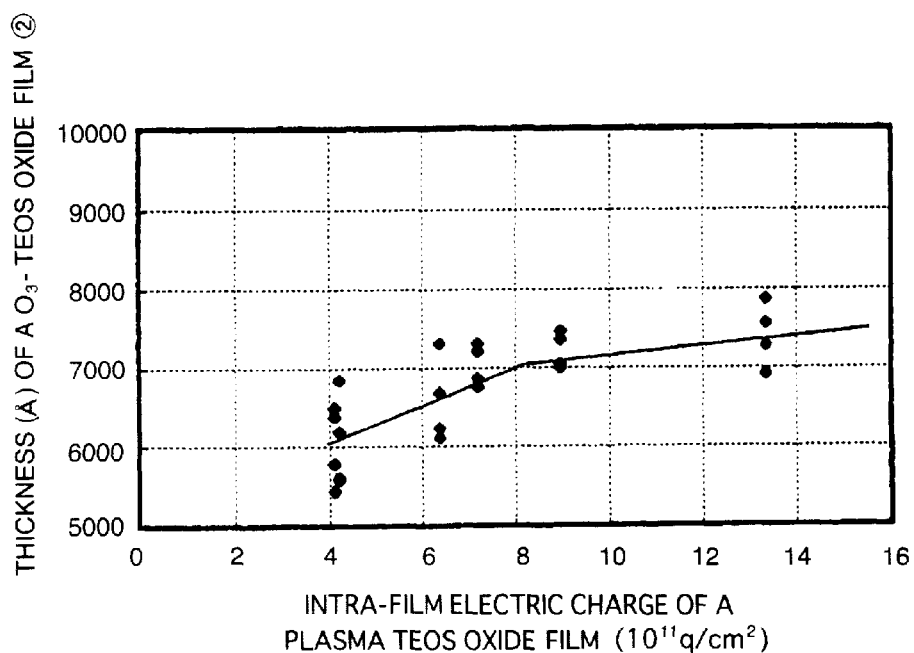
FIG. 5 is a characteristic diagram of the thickness of an upper layer of the interlayer insulating film, formed over a metal pattern (grounded) conductive with the substrate of the semiconductor device, according to the embodiment of the invention.
Figure 6:
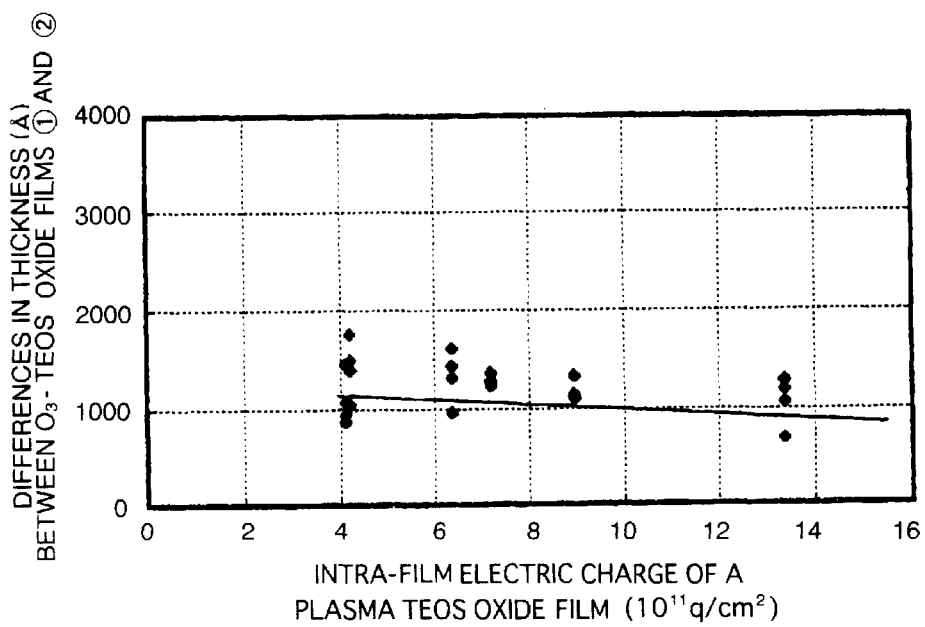
FIG. 6 is a diagram showing differences in thickness between the upper layer of the interlayer insulating film shown in FIG. 4 and the same in FIG. 5.

Now, in the case where the underlayer, that is, the plasma TEOS oxide film (thickness: 3000 Å) is formed over the metal pattern by changing the Qox value, that is, the low frequency output, and subsequently, an upper layer film, that is, the $O_3$-TEOS oxide film (thickness: 8000 Å) is formed on top of the underlayer, the thickness of the $O_3$-TEOS oxide film formed over the metal pattern is shown in FIGS. 4 to 6.

FIG. 4 is a characteristic diagram of the thickness or the upper layer film over the metal pattern (floating) not conductive with the substrate of the semiconductor device, the horizontal axis thereof indicating an intra-underlayer electric charge (unit: $10^{11}$ q/cm$^2$) while the vertical axis thereof indicating the thickness (Å).

FIG. 5 is a characteristic diagram of the thickness of the upper layer film over the metal pattern (grounded) conductive with the substrate of the semiconductor device, the horizontal axis thereof indicating an intra underlayer electric charge (unit: $10^{11}$ q/cm$^2$) while the vertical axis thereof indicating the thickness (Å).

FIG. 6 is a diagram showing differences in thickness between the upper layer film in FIG. 4 and the same in FIG. 5, the horizontal axis thereof indicating an intra-underlayer electric charge (unit: $10^{11}$ q/cm$^2$) while the vertical axis thereof indicating differences (Å) in thickness.

It is evident from FIGS. 4 to 6 that according as the intra-underlayer electric charge of the underlayer increases (the low frequency output becomes higher), the thickness of films over the metal patterns becomes thicker, and differences in thickness between the films over the metal patterns formed in varying layouts (between the metal pattern not conductive with the substrate, and the metal pattern conductive with the substrate) becomes smaller. Further, this shows that the $O_3$-TEOS oxide film at the upper layer is rendered thicker in thickness since the plasma TEOS oxide film formed over the metal pattern will have the same thickness regardless of processing conditions.

Thus, according to the invention, it becomes possible to optionally change the thickness of the upper layer $O_3$-TEOS oxide film to be formed at the upper layer by forming the plasma TEOS oxide film at the underlayer, having the intra-film electric charge at varying values. In particular, the greater the intra-film electric charge of the underlayer film, the thicker the upper layer film formed is rendered in thickness, and the differences in thickness between the upper layer films over the metal patterns formed in varying layouts can be reduced.

An increase in the thickness of the upper layer films over the metal patterns has an advantageous effect in that the self-flattening property thereof as the interlayer insulating film is improved, and the interlayer insulating film becomes less susceptible to generation of metal remnants when forming an upper layer metal pattern.

Further, it is to be understood that the scope of the invention is not limited to the embodiment described in the foregoing, and that various changes and modifications may be made in the invention without departing from the spirit and scope thereof, and should be considered to be within the scope of the invention.

Thus, as described in detail hereinbefore, the invention can demonstrate the following advantageous effects.

It becomes possible to optionally change the thickness of the $O_3$-TEOS oxide film to be formed at the upper layer by forming the plasma TEOS oxide film at the underlayer, having the intra-film electric charge at varying values. In particular, the greater the intra-film electric charge of the underlayer film, the thicker the upper layer film formed is rendered in thickness, and the differences in thickness between the upper layer films over the metal patterns formed in varying layouts can be reduced.

The increase in the thickness of the upper layer film over the metal patterns has an advantage in that the self-flattening property thereof as the interlayer insulating film is improved, and the interlayer insulating film becomes less susceptible to generation of metal remnant when forming the upper layer metal patterns.

What is claimed is:

1. A method of forming an insulating film of a semiconductor device by laminating a first oxide film formed from an $O_2$ gas and a TEOS gas as an underlayer of the insulating film by a plasma CVD method, to a second oxide film formed from an $O_3$ gas and a TEOS gas as an upper layer by the same plasma CVD method, the method comprising adjusting a thickness of the second oxide film by changing a static charge within the first oxide film.

2. The method of forming an insulating film according to claim 1, wherein said adjusting comprises changing an RF output in a low frequency band applied during the plasma CVD method.

3. The method of forming an insulating film according to claim 1, wherein said adjusting comprises changing a ratio of a TEOS gas flow rate to an $O_2$ gas flow rate applied during the plasma CVD method.

4. A method of fabricating a semiconductor device, comprising:

providing a semiconductor substrate having a surface;

forming a conductive pattern on the surface of the semiconductor substrate;

forming a first oxide film so as to cover the conductive pattern and the surface of the semiconductor substrate, using oxygen and tetraethylorthosilicate, wherein the first oxide film contains an electric charge larger than $2\times10^{11}$ q/cm$^2$, and wherein q denotes a charge on an electron; and forming a second oxide film on the first oxide film, using ozone and tetraethylorthosilicate.

5. The method according to claim 4, wherein said forming a first oxide film comprises:

generating a high frequency band of RF and a low frequency band of RF; and raising an output of the low frequency band.

6. The method according to claim 5, wherein the first oxide film and the second oxide film are formed by a CVD method.

7. The method according to claim 4, wherein said forming a first oxide film comprises:

flowing an oxygen gas at an initial flow rate; and lowering the initial flow rate.

8. The method according to claim 7, wherein the first oxide film and the second oxide film are formed by a CVD method.

9. A method of fabricating a semiconductor device, comprising:

providing a semiconductor substrate;

forming a first oxide film on the semiconductor substrate, using oxygen and tetraethylorthosilicate, wherein the first oxide film contains an electric charge larger than $2 \times 10^{11}$ q/cm$^2$, and wherein q denotes a charge on an electron; and forming a second oxide film on the first oxide film, using ozone and tetraethylorthosilicate.

10. The method according to claim 9, further comprising:

forming a conductive pattern on the semiconductor substrate before said forming a first oxide film.

11. The method according to claim 9, wherein said forming a first oxide film comprises:

generating a high frequency band of RF and a low frequency band of RF; and raising an output of the low frequency band.

12. The method according to claim 11, wherein the first oxide film and the second oxide film are formed by a CVD method.

13. The method according to claim 11, wherein said forming a first oxide film comprises:

flowing an oxygen gas at an initial flow rate; and lowering the initial flow rate.

14. The method according to claim 13, wherein the first oxide film and the second oxide film are formed by a CVD method.

* * * * *